Nov. 27, 1962 W. M. KAUFMAN 3,066,230

CONTROL CIRCUIT COMPRISING BACK-TO-BACK CONNECTED HYPERCONDUCTIVE DIODES IN SERIES WITH LOAD

Filed June 19, 1958 2 Sheets-Sheet 1

WITNESSES

Myron E. Click

INVENTOR

William M. Kaufman

BY

F. E. Browder

ATTORNEY

United States Patent Office 3,066,230
Patented Nov. 27, 1962

3,066,230

CONTROL CIRCUIT COMPRISING BACK-TO-BACK CONNECTED HYPERCONDUCTIVE DIODES IN SERIES WITH LOAD

William M. Kaufman, Monroeville, Pa., assignor to Westinghouse Electric Corporation, East Pittsburgh, Pa., a corporation of Pennsylvania Filed June 19, 1958, Ser. No. 743,134
3 Claims. (Cl. 307—88.5)

This invention relates to control circuits in general and in particular to control circuits controlling the effective and average currents through a load.

The advent of semiconductor diodes having such characteristics that on exceeding certain specified reverse current and voltages the diode becomes highly conductive and thereafter will carry a substantial reverse current at low voltages has led to many new electronic applications. The phenomena described above is not a Zener type breakdown, nor is it an avalanche breakdown. This unique breakdown has been designated as a hyperconductive breakdown and a diode having such a characteristic will be referred to hereinafter as a hyperconductive diode.

An example of such a hyperconductive diode with controllable reversible breakdown characteristic or hyperconductive breakdown may be constructed from the following elements. A first base element consists of a semiconductor member doped with an impurity to provide a first type of semiconductivity, either N or P. Upon this first base element is an emitter element consisting of semiconductor material doped with the opposite type of semiconductivity. This emitter may be prepared by alloying a pellet containing a doping impurity to a wafer of semiconductor material forming the first base. An emitter junction is present at the zone between the first base element and the emitter element.

In order to facilitate the connecting of the diode into an electrical circuit, a layer of silver or other good conductor metal may be fused, alloyed into, or soldered with the upper surface of the emitter. Copper lead wires may be readily soldered to this layer.

A second base of opposite conductivity is provided next to the first base. A zone where the first and second base elements meet forms a collector junction.

Next to the second base element is a mass of metal which is a source of carriers that play a critical part in the functioning of the diode. This mass of metal may be neutral or it may have the same doping characteristics as the second base. The mass of metal may be applied to the second base element by a soldering, alloying, fusing or other similar well-known method.

Such a hyperconductive semiconductor diode is described in a copending application Serial No. 642,743, entitled "Semiconductor Diode," filed February 27, 1957, now Patent No. 2,953,693, and assigned to the same assignee as the present invention. For a more detailed description of the construction, characteristics and operation of such a hyperconductive diode, reference is made to the above copending application, Serial No. 642,743.

Another example of a diode having characteristics similar to those described hereinbefore, which may also be employed in the circuitry carrying out the teachings of this invention is described in an article entitled "The Four Layer Diode," by Dr. William Shockly, Electronic Industries and Tele Tech, August, 1957, pages 58–60, 161–165.

It is an object of this invention to provide an improved control circuit.

It is another object of this invention to provide an improved control circuit which may control the effective and average current in a load.

Further objects of this invention will become apparent from the following description when taken in conjunction with the accompanying drawings. In said drawings, for illustrative purposes only, there are shown preferred forms of the invention, in which.

Figure 1:
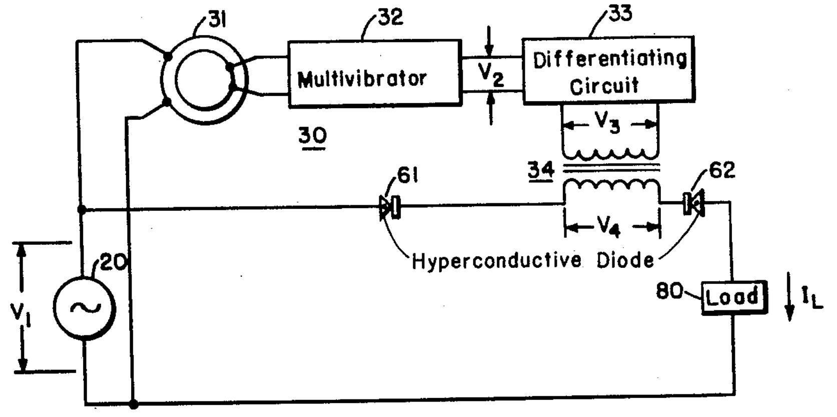
FIGURE 1 is a schematic diagram illustrating the teachings of this invention.

Referring to FIG. 1, the illustrated embodiment of the present invention comprises in general an alternating power source 20, hyperconductive diodes 61 and 62, a control circuit 30 and a load 80.

The alternating power source 20 is connected in series circuit relationship with the hyperconductive diode 61, a secondary winding of a pulse transformer 34, the hyperconductive diode 62 and the load 80. Thus the diodes 61 and 62 are connected in a series back-to-back manner. The control circuit 30 comprises a phase shifting device 31, a multivibrator 32, a differentiating circuit 33 and a pulse transformer 34. The phase shifting device 31 is connected across the alternating power source 20. The output of the phase shifting device 31 is connected to an input of the multivibrator 32. The output of the multivibrator 32 is connected to an input of the differentiating circuit 33. The output of the differentiating circuit 33 is connected across a primary winding of the pulse transformer 34.

Figure 2:
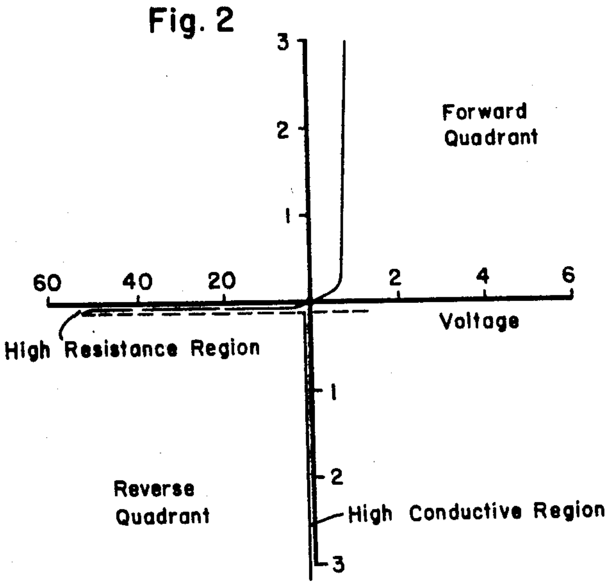
FIG. 2 is a graphical representation of the characteristics of the hyperconductive diode utilized in this invention.

Referring now to FIG. 2, the curve shows how a semiconductor hyperconductive diode, as utilized for the diodes 61 and 62, responds to the application of different voltages. Considering the upper right or forward quadrant, when a forward voltage of the order of 1 voltage unit is applied, the current builds up to about 3 current units. When the voltage is reversed, it builds up in the reverse direction to approximately 55 voltage units with only a small fraction of a current unit of current flowing, and then the diode suddenly becomes highly conductive or hyperconductive and the voltage drops to about 1 voltage unit as shown in the lower left or reverse quadrant. The diode then becomes a conductor with low ohmic resistance and the current builds up rapidly to several current units.

As shown in the reverse quadrant, when the diode breaks down the voltage drops along a substantially straight line to about 1 voltage unit, and very little power is dissipated in maintaining the diode highly conductive in the reverse direction. The diode can be rendered highly resistant again in the reverse direction by reducing the current below a minimum threshold value and the voltage below breakdown value. Consequently, the curve can be repeatedly followed as desired by properly controlling the magnitude of reverse current and voltage.

Referring again to FIG. 1, the peak value of the alternating power source 20 is designed to have a smaller value than the critical breakdown voltage in the reverse direction of the hyperconductive diodes 61 and 62. Thus, no current may flow through the load 80 until the control circuit 30 has added additional breakdown pulses of voltage across the respective hyperconductive diodes 61 and 62.

The multivibrator 32 may be any one of a number of multivibrators that are well-known to those skilled in the art. It may be either of a vacuum tube or semiconductor construction. In the interests of greater reliability, a semiconductor or static multivibrator may be used. For description of the characteristics, construction and operation of a reliable multivibrator, that may be keyed or driven by a reference frequency, reference is made to Patent No. 2,783,384, R. L. Bright et al., issued February 26, 1957, and assigned to the same assignee as the present invention.

The multivibrator as described in Patent No. 2,783,384 utilizes the characteristics of switching transistors, in combination with a saturable magnetic core to produce a square wave output. Provision is made for the application of an input voltage which determines the frequency of the square wave voltage.

Figure 3:
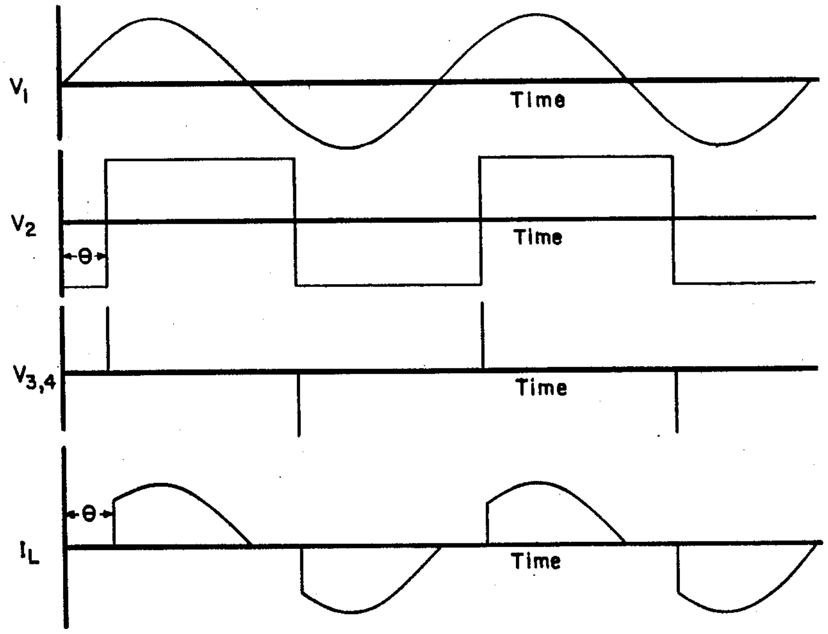
FIG. 3 is a graphical representation of the wave forms present at selected points in the apparatus of FIG. 1.

In FIG. 1 the square wave output voltage $V_2$ of the multivibrator 32 is fed through the differentiating circuit 33 to the primary winding of the pulse transformer 34. The voltage $V_3$ appearing across the primary winding of the transformer 34 is in the form of a pulse which cooperates with the existing supply voltage from the power supply 20 to break down the hyperconductive diodes 61 and 62 alternately so that a current may be supplied to the load 80. The control circuit 30 is synchronized or keyed with the alternating power supply 20 by the connection shown in FIG. 1 so that the pulse voltage $V_4$ will aid the supply voltage in overcoming the reverse resistance of the respective diodes 61 or 62 which are blocking the flow of current in the load 80. When the sum of the pulse voltage $V_4$ and the supply voltage $V_1$ exceeds the breakdown voltage of the respective diode 61 or 62 which is blocking, that diode will conduct and current will flow through the load 80. The wave forms just described are graphically represented in FIG. 3 to show the respective relationships and the resulting current $I_L$ which will flow through the load 80.

The addition of the phase shift device 31 between the reference frequency obtained from the alternating power supply 20 and the multivibrator 32 makes it possible to control the effective current through the load 80 by varying the phase relationship between the supply voltage $V_1$ and the multivibrator output voltage $V_2$. The effective current $I_L$ can be varied from approximately zero to approximately 0.707 ($V_1$ peak)/$R_L$, where $R_L$ is the resistance of the load, by varying the phase angle difference $\theta$, between the keying output wave and the supply voltage by means of the phase shift device 31, as denoted in FIG. 3, between 0 and 90°.

Figure 4:
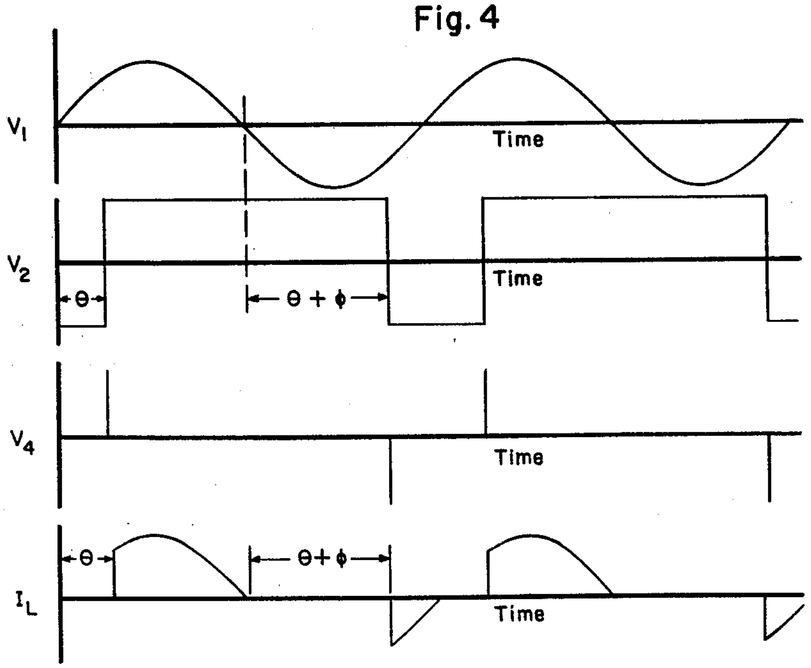
FIG. 4 is a graphical representation of wave forms present in FIG. 1.

It is possible to obtain a variety of outputs to the load 80 by changing the relative lengths of time of the positive and negative portions of the square wave voltage $V_2$ within one cycle. For example, as is shown in FIG. 4, the positive part of the square voltage $V_2$ is three times as long as the negative portion. The resultant current wave forms for the current $I_L$ that result are also shown in FIG. 4. It is apparent that the average load current is no longer zero since the wave shape is not symmetrical. The use of hyperconductive diodes 61 and 62 in the apparatus illustrated in FIG. 1 permits the control of both the firing angle $\theta$ and the firing angle ($\theta$ plus $\phi$) thus controlling both the effective current and the average current of the load 80. The changing of the relative lengths of time of the positive and negative portions of the multivibrator output voltage $V_2$ within one cycle is accomplished by controlling the circuit parameters within the chosen multivibrator circuit in a manner well known to those skilled in the art.

In the prior art magnetic amplifiers have been used to control the firing angle $\theta$ but the hyperconductive diodes in the embodiment of the teachings of the invention herein described will respond much faster than magnetic amplifiers since the switching of states of a hyperconductive diode may be accomplished in times less than the order of 1 microsecond. Transistors have been used in the prior art in switching circuits to control both of the firing angles $\theta$ and ($\theta$ plus $\phi$) but the hyperconductive diodes are more readily adaptable to higher power applications than available transistors.

In conclusion, it is pointed out that while the illustrated example constitutes a practical embodiment of my invention, I do not limit myself to the exact details shown, since modification of the same may be varied without departing from the spirit and scope of this invention.

I claim as my invention:

1. In a control circuit, in combination; a pair of semiconductor devices; said devices each having a relatively low impedance to current flow in one direction and a controllable breakdown characteristic in the opposite direction; means connecting said semiconductor devices back-to-back in circuit relationship in a load circuit; means for applying an alternating power source to said load circuit; and a control circuit for supplying a breakdown signal to said semiconductor devices; said control circuit comprising a multivibrator, a pulse transformer and means for keying said multivibrator from said alternating power source; said pulse transformer being connected in circuit relationship to apply the output of said multivibrator across said semiconductor devices.

2. In a control circuit, in combination; a pair of semiconductor devices; said devices each having a relatively low impedance to current flow in one direction and a controllable breakdown characteristic in the opposite direction; means connecting said semiconductor devices back-to-back in circuit relationship in a load circuit; means for applying an alternating power source to said load circuit; and a control circuit for supplying a breakdown signal to said semiconductor devices; said control circuit comprising a phase shift device, a multivibrator, and a pulse transformer; said phase shift device connecting said alternating power source to key said multivibrator; said pulse transformer being connected in circuit relationship to apply the output of said multivibrator across said semiconductor devices.

3. In a control circuit, in combination; a pair of semiconductors devices; said devices each having a relatively low impedance to current flow in one direction and a controllable breakdown characteristic in the opposite direction; means connecting said semiconductor devices back-to-back in circuit relationship in a load circuit; means for applying an alternating power source to said load circuit; and a control circuit for supplying a breakdown signal to said semiconductor devices; said control circuit comprising a phase shift device, a multivibrator, a differentiating circuit, and a pulse transformer; said phase shift device being connected to key said multivibrator from said alternating power source; the output of said multivibrator being connected through said differentiating circuit to said pulse transformer; said pulse transformer being connected in series circuit relationship with said semiconductor devices.

References Cited in the file of this patent

UNITED STATES PATENTS

| | | |
|---|---|---|
| 2,306,230 | Somerville | Dec. 22, 1942 |
| 2,535,303 | Lewis | Dec. 26, 1950 |
| 2,723,355 | Graham | Nov. 8, 1955 |
| 2,905,885 | Burt et al. | Sept. 22, 1959 |
| 2,917,698 | Petrocelli | Dec. 15, 1959 |
| 2,962,607 | Bright | Nov. 29, 1960 |
| 2,993,129 | Petrocelli et al. | July 18, 1961 |

FOREIGN PATENTS

| | | |
|---|---|---|
| 66,575 | France | Dec. 3, 1956 |